July 21, 1964 J. F. MARTIN ETAL 3,142,056

ANALOG-TO-DIGITAL QUANTIZER

Filed Aug. 31, 1962

INVENTORS.
JOSEPH F. MARTIN
JACK SHIRMAN
BY Samuel R. Genca
AGENT

United States Patent Office 3,142,056
Patented July 21, 1964

3,142,056
ANALOG-TO-DIGITAL QUANTIZER

Joseph F. Martin, Webster, and Jack Shirman, Rochester, N.Y., assignors to General Dynamics Corporation, Rochester, N.Y., a corporation of Delaware Filed Aug. 31, 1962, Ser. No. 220,694
4 Claims. (Cl. 340—347)

Figures 1, 2:
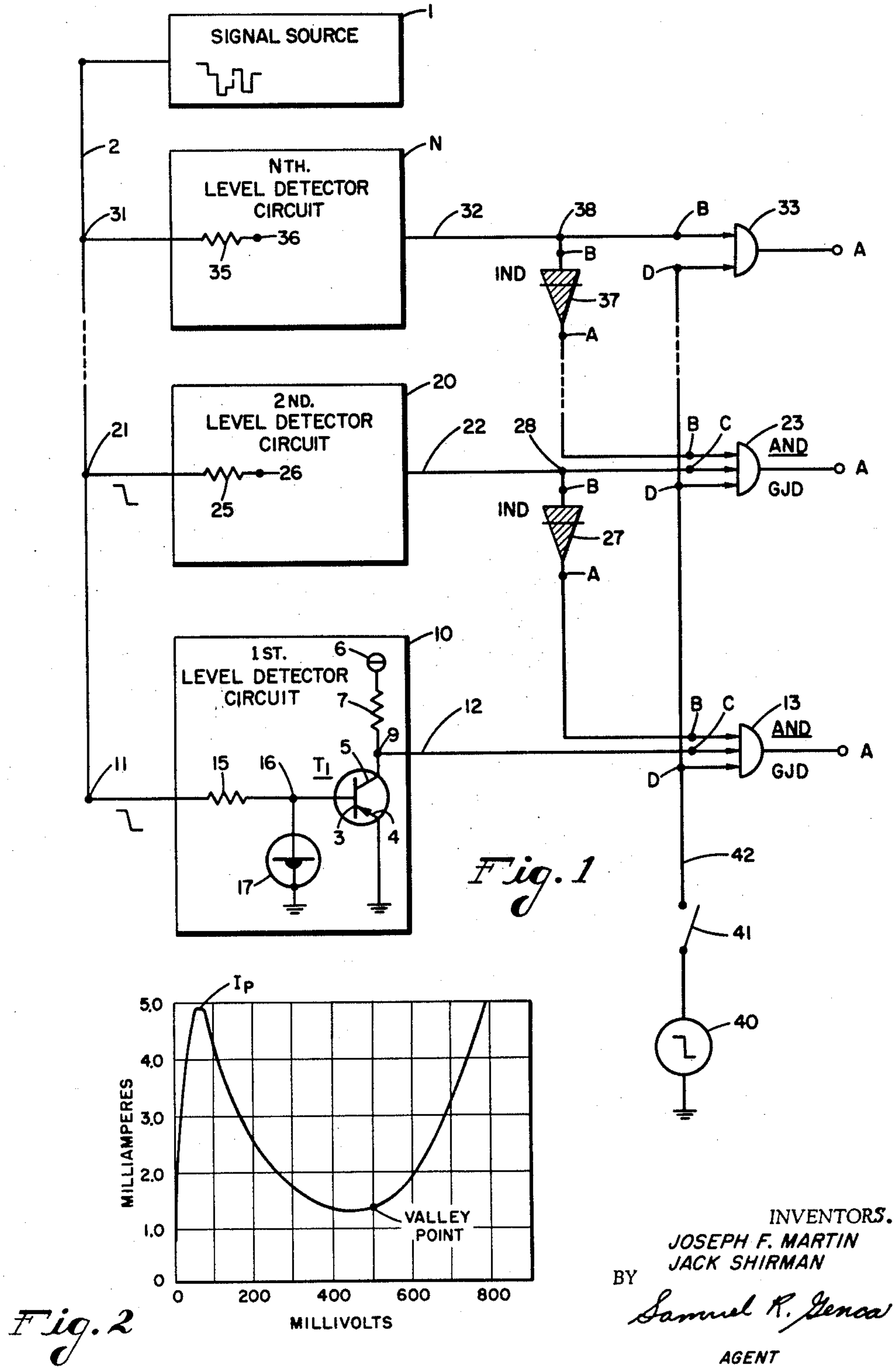

The present invention relates generally to electrical intelligence signal transmission and, more particularly, to an analog-to-digital quantizer.

It is a general object of this invention to provide a new and improved method and arrangement for quatizing fluctuating direct current signals.

It is a more particular object of this invention to provide a new and improved quantizer for compressing and quantizing fluctuating direct current signals into $n$ number of preselected decibel levels and supplying an output signal on one, and only one, of a corresponding plurality of output terminals, each of which corresponds to a preselected decibel level, and the selection of the output terminal depends upon the decibel level of the fluctuating direct current signal sampled.

It is yet another object of the present invention to provide a quantizer for quantizing a given decibel range of audio input signals into preselected decibel levels each spaced apart a given number of decibels and for producing one, and only one, output signal in response to an input signal falling within each decibel level.

It is a further object of the present invention to provide quantization of input signal potentials of approximately 50 millivolts or more with differences between levels of the same order of magnitude.

An additional object of the present invention is to provide a novel quantizer for a vocoder.

It is still another object of the present invention to provide for the converting of data from analog-to-digital form accurately and rapidly.

It is yet another object of the present invention to provide an analog-to-digital converter which is capable of rapid conversion, and is compatable with high-speed data processing equipment.

The present invention accomplishes the above cited objects by providing an analog-to-digital quantizer which, when connected to a source of fluctuating signal potential, will quantize the fluctuating signal potential into one, and only one, of a finite number of levels corresponding to the amplitude of the input signal sampled. The quantizer comprises a first level detector circuit means including a first output terminal and means for deriving a first digital signal at a first output terminal in response to a signal potential beyond a first predetermined potential level. Further included is a second level detector circuit means connected in parallel to the source and including a second output terminal and means for deriving a second digital signal at a second output terminal in response to a signal potential beyond a second predetermined potential level. The quantizer further includes a normally open AND gate connected to the first output terminal of the first level detector circuit means for passing a first digital signal therethrough. The quantizer also includes an inverter amplifier connected between the second out-output terminal of the second level detector circuit means and the AND gate for closing the AND gate in response to the presence of a second digital signal from the second level detector circuit means. The quantizer may be readily expanded for more level of quantization by including level detector circuit means connected in series with an AND gate for each level and inverter amplifier. Each serially-connected level detector circuit and AND gate is responsive to a preselected potential level for deriving a digital signal, and the inverter amplifier inverts the digital signal to prevent the enabling of the AND gate at the next lower potential level.

The invention features, in a preferred embodiment, a plurality of parallel connected level detector circuit means each including a tunnel diode and a transistor connected in parallel to a predetermined current-limiting resistor having a resistance value proportional to the potential detecting level to derive a peak current in order to trigger the tunnel diode and turn on the transistor and wherein any signal potential lower than the potential detecting level is dissipated to ground through the low impedance tunnel diode.

Further objects and advantages of the invention will become apparent as the following description proceeds and features of novelty which characterize the invention will be pointed out with particularity in the claims annexed to and forming a part of this specification.

For a better understanding of the invention, reference may be had to the accompanying drawing, in which:

FIG. 1 shows a schematic diagram of an analog-to-digital quantizer in accordance with the invention; and FIG. 2 is a graph illustrating a characteristic curve of a tunnel diode utilized in an embodiment of the invention.

Although the present invention is suited for more general application, it is particularly adapted for use in quantizing audio signals in a vocoder. As is well known, a vocoder is a device for analyzing speech to obtain the pertinent information contained therein, transmitting this information to a distant point and at the distant point utilizing the transmitted information to synthesize the original speech. The advantage of a vocoder is that the transmission bandwidth to transmit the pertinent information contained in speech is much smaller than the bandwidth necessary to transmit the speech itself.

In analyzing speech, the vocoder separates the speech frequency spectrum into a predetermined number of contiguous frequency bands in an analyzing circuit and derives a signal for each frequency band which is an analog of the energy contained therein. These analog signals are then quantized into discrete amplitude levels by a quantizer and then transmitted in digital form by wire or radio to a synthesizer located at a distant point. The synthesizer utilizes the digital information to recreate the original speech.

Referring now to FIG. 1, there is illustrated in logic schematic form an analog-to-digital quantizer embodying the present invention. A particular logic symbol is used to represent each circuit component, such as an inverter amplifier and AND gate. The logic symbols are well known and may be seen in U.S. Letters Patent No. 2,933,564, issued to James G. Pearce et al. on April 19, 1960, and assigned to the same assignee as the present invention. Although the circuit components are entirely conventional in design, it is believed expedient to a more complete understanding of the invention to briefly describe the operation of the inverter amplifier IND and AND gate GJD.

The logic symbol for an inverter amplifier IND is indicated by a vertical line extending through the conventional triangular symbol for an amplifier. The inverter amplifiers, IND 27 and 37, include a transistor, not shown, which is normally conductive and is triggered nonconductive by negative-going input signals at terminal B. The inverter amplifiers IND 27 and 37 are shown as a shaded logic symbol since they have an output signal which normally stands at ground potential.

AND gate GJD is shown as a conventional gate having input terminals B, C, D, and an output terminal A. The AND gate GJD is a positive AND gate; that is output terminal A will be at a positive or ground potential only when all of the input terminals B, C, D are returned to a positive or ground potential and will drop to a negative potential when any one or more of terminals B, C and D is returned to a negative potential.

Shown at 1 is a source of signal potential which may be, for example, the analyzing circuit of a vocoder described heretofore. The direct current signal potential may be negative with respect to ground.

The analog-to-digital quantizer includes a plurality of level detector circuits 10, 20 to N, inclusive, which correspond to the level of quantization desired. Although three level detector circuits 1, 2 and N are shown, it should be understood that any number of level detector circuits may be included in the quantizer.

The signal source 1 is connected in parallel to each of the level detector circuits 10, 20 to N at input terminals 11, 21, 31, respectively. As shown, level detector circuit 10 includes a current-limiting resistor 15 connected to input terminal 11. The other side of the current-limiting resistor 15 is connected to a junction 16 through to a low impedance tunnel diode 17 to ground. A common emitter amplifier including a P-N-P transistor is also connected at the junction 16 in parallel with the tunnel diode 17. The P-N-P transistor $T_1$ includes a base 3 connected to the junction 16, an emitter 4 connected to ground, and a collector 5 connected to a source of negative potential 6 through a resistor 7. The output of level detector circuit 10 is located at junction 9 which connects to lead wire 12. Lead wire 12 is connected to AND gate GJD 13.

Shown at 40 is a signal generator for enabling AND gates 13, 23 and 33. The AND gates are cyclically enabled by switch 41 which may be an electronic switch. The signal generator 40 applies negative and ground potential at each of the AND gates 13, 23 and 33 to close or open each of AND gates 13, 23 and 33.

Each of the level detector circuits 20 to N is identical in structure to that of lever detector circuit 10 except for the current-limiting resistor 16 which, in conjunction with the transistor $T_1$ and tunnel diode 17, establishes the potential level at which the level detector circuit 10 will produce an output signal on lead 12. Each of the level detector circuits 20 to N includes a current-limiting resistor. Level detector circuit 20 includes a current-limiting resistor 25, while level detector circuit N includes a current-limiting resistor 35. Lead wire 22 connects level detector circuit 20 to junction 28. One side of junction 28 is connected to inverter IND 27 at terminal B. The other side of inverter IND 27 is connected at terminal A to terminal B of AND gate 13. The other side of junction 28 is connected to terminal C of AND gate 23. Lead wire 32 connects level detector circuit N to junction 38. One side of junction 38 is connected to inverter IND 37 at terminal B. The other side of inverter IND 37 is connected to terminal B of AND gate 23. The other side of junction 38 is connected to terminal B of AND gate 33. AND gate 33 is similar to AND gates GJD 13 and 23 except that only two input terminals B and D are required, and that positive signals will enable the AND gate 33. A negative signal at terminal D will render the AND gate 33 inoperative.

In accordance with the invention, each of the level detector circuits 10, 20 to N may be adjusted to detect signal potentials with respect to a predetermined potential level or with respect to ground. The level detector circuits 10, 20 to N each includes a tunnel diode 17 which is current operated. The tunnel diode 17 will trigger from one state to another state depending upon a predetermined peak current input. The tunnel diode 17 is ideally suited for switching circuits. The characteristic curve of tunnel diode 17 is shown in FIG. 2. The tunnel diode 17 is a low impedance device for current value less than the peak current $I_p$ shown in FIG. 2. Any current less than the peak current $I_p$ of the tunnel diode 17 will be conducted through the low impedance tunnel diode 17 to ground. However, if the signal current at junction 16 is equal to or greater than the peak current $I_p$ of the tunnel diode, it will switch to the valley point as shown on the curve of FIG. 2 and supply enough negative potential to turn on the transistor $T_1$. Since the level detector circuits 10, 20 to N are connected in parallel, the current-limiting resistors 15, 25 and 35 limit the current appearing at junctions 16, 26 and 36, respectively. Thus, the level of quantization for the level detector circuits 10, 20 to N may be set by the current-limiting resistors 15, 25 and 35. That is, the potential level for each level detector circuit 10, 20 to N can be adjusted by keeping the current constant and adjusting the resistance value of resistors 15, 25 and 35 to derive the peak current $I_p$ of the tunnel diode 17. Stated in another way, each of the resistors 15, 25 and 35 can be determined by the following equation $$R=\frac{E_d}{I_p}$$

wherein R is the resistance value of the current-limiting resistor, $I_p$ is the peak current of the tunnel diode 17, and $E_d$ is the potential detection level. The detection levels may be in equal increments or may be in equal db potential levels.

In one embodiment of the invention, a 1N2930 tunnel diode was employed in each of the level detector circuits 10, 20 to N to detect three potential levels of 0.47 volt, 0.94 volt and 1.41 volts, respectively. The peak current of a 1N2930 tunnel diode is 4.7 milliamperes as shown in FIG. 2. Based on the above equation, level detector circuit 10 included a resistor 15 having a resistance value of 100 ohms, while level detector circuit 20 had a current-limiting resistor 25 having a resistance value of 200 ohms, and level detector circuit N had a current-limiting resistor 35 having a resistance value of 300 ohms.

In operation of the analog-to-digital quantizer, let it be assumed that the signal source 1 is putting out a negative fluctuating direct current signal potential with respect to ground having a range of 0.47 to 1.50 volts. Let it also be assumed that in a particular instant of time, a 0.47 volt negative signal with respect to ground is applied through conductor 2 to each of the parallel level detector circuits 10, 20 to N. Since level detector circuit 10 is set by current-limiting resistor 15 to detect level potentials of 0.47 volt or higher, a peak current of 4.7 milliamperes will appear on junction 16. The tunnel diode 17 will turn on transistor $T_1$, which in turn will return lead 12 to ground opening the AND gate 13. During the same period of time, the signal current appearing on terminal 26 of level detector circuit 20 and terminal 36 of level detector N will be less than the peak current $I_p$ required to switch the tunnel diode 17, in which case the current is drained off to ground through the tunnel diode 17 in each of level detector circuits 20 and N. As a result, no signal will appear on conductors 22, 32 connected to level detector circuits 20 and N. During this same instance of time, signal generator 40 is connected to conductor 42 by switch 41 and applies ground potential to open AND gate 13. AND gate 13 is the only AND gate which is enabled since terminals B, C and D of AND gate 13 are returned to ground potential by inverter 27, level detector circuit 10, and signal generator 40, respectively. AND gates 23 and 33 are not open since conductors 22 and 32 are not returned to ground.

Now, let it be assumed that a negative signal potential of 0.94 volt is transmitted by signal source 1 through conductor 2 to each of level detector circuits 10, 20 and N. The signal current appearing on junctions 16 and 26 of level detector circuits 10 and 20 will be 4.7 milliamperes, while the signal current on junction 36 will be less than 4.7 milliamperes. The signal current appearing on junction 36 will be drained through the low impedance tunnel diode 17 to ground resulting in no output signal on lead 32. During this same instant of time, tunnel diodes 17 of level detector circuits 10 and 20 will turn on transistors $T_1$ in each of level detector circuits 10 and 20, placing ground potential on leads 12 and 22. Ground potential appearing on junction 28 will render inverter 27 nonconductive, removing ground potential from input terminal B of AND gate 13 thus inhibiting or closing AND gate 13. On the other hand, terminals B and C of AND gate 23 are now at ground potential, so that returning terminal D of AND gate 23 to ground potential by signal generator 40 through switch 41 opens AND gate 23, which in turn places a digital signal on output terminal A of AND gate 23. Thus, only one signal, and only one signal, appears on output terminal A of AND gate 23, while no signal appears on the output terminal A of AND gates 13 and 33. In a similar manner, a signal of 1.41 volts will put ground potential on leads 12, 22 and 32. However, inverter 27 will inhibit AND gate 13 and inverter 37 will inhibit AND gate 23 in response to a signal from level detector circuits 20 and N, respectively. By applying ground potential to AND gates 13, 23 and 33 by generator 40, only AND gate 33 is opened, which results in one, and only one, digital signal at terminal A of AND gate 33, all other AND gates being closed. The presence of a digital signal on output terminal A of AND gates 13, 23 and 33 indicates the level of quantization.

While there has been shown and described what is considered at present to be the preferred embodiment of the invention, modifications thereto will readily occur to those skilled in the art. For example, negative AND gates may be substituted for positive AND gates 13, 23 and 33. This will, of course, necessitate adding inverters at the inputs of each of the newly added negative AND gates to invert signals from level detector circuits 10, 20 to N. It will also be necessary to remove inverters 27 and 37 and feed directly from the level detector circuits 20 and N, respectively, to AND gates 13 and 23, respectively. The quantizer shown in FIG. 1 may be modified in still another manner. For example, signal generator 40 and switch 41, along with their connections to each of AND gates 13, 23 and 33, may be eliminated. AND gates 13, 23 and 33 may be normally open AND gates which can be closed by inverters 27 and 37 in response to the presence of a second digital signal from the first and second level detector circuits 20 and N, respectively, thereto. It is not desired, therefore, that the invention be limited to the embodiment shown and described, and it is intended to cover in the appended claims all such modifications as fall within the true spirit and scope of the invention.

What is claimed is:

1. Apparatus comprising a transistor having a base, an emitter and a collector, said emitter being connected to a point of reference potential, a first resistance connecting said collector to a point of fixed operating potential with respect to said point of reference potential, a tunnel diode having one end thereof connected directly to said base and the other end thereof connected directly to said emitter, a source of fluctuating signal potential, and a second resistance of predetermined value having one end thereof connected to said base and the other end thereof connected to said source for applying said signal potential to said base, said transistor being switched from a non-conducting to a conducting state in response to said base assuming a first predetermined potential difference with respect to said emitter and said tunnel diode being switched from a low to a high impedance in response to the potential difference thereacross reaching a second predetermined potential difference which is less than said first predetermined potential difference, whereby an output signal is produced at said collector in response to the value of said fluctuating signal potential exceeding a precise particular value which is determined by the predetermined value of said second resistance.

2. The apparatus defined in claim 1, further including a second transistor having a base, an emitter and a collector, said emitter of said second transistor being connected to said point of reference potential, a third resistance connecting said collector of said second transistor to a point of fixed operating potential with respect to said point of operating potential, a second tunnel diode having one end thereof connected directly to said base second transistor and the other end thereof connected directly to said emitter of said second transistor, and a fourth resistance of a second predetermined value having one end thereof connected to said base of said second transistor and the other end thereof connected to said source for applying said signal potential to said base of said second transistor, said second transistor being switched from a non-conducting to a conducting state in response to said base of said second transistor assuming said first predetermined potential difference with respect to said emitter of said second transistor and said second tunnel diode being switched from a low to a high impedance in response to the potential difference thereacross reaching said second predetermined potential difference, the ratio of the predetermined value of said fourth resistance to the predetermined value of said second resistance being greater than unity, whereby a second output signal is produced at the collector of said second transistor in response to the value of said fluctuating signal potential exceeding a second precise particular value which is greater than said first-mentioned precise particular value and which is determined by the predetermined value of said fourth resistance.

3. The apparatus defined in claim 2, further including gate means coupled to the collectors of said first-mentioned transistor and said second transistor for passing said first output signal only in response to the absence of said second output signal.

4. The apparatus defined in claim 3, wherein said gate means includes an AND gate, an inverter, means for applying said first output signal as a first input to said AND gate, means for applying said second output signal as an input to said inverter, and means for applying the output of said inverter as a second input to said AND gate.

References Cited in the file of this patent

UNITED STATES PATENTS 3,041,469 Ross ---------------- June 26, 1962